(12) United States Patent
Ahn et al.

(10) Patent No.: US 11,545,596 B2
(45) Date of Patent: Jan. 3, 2023

(54) OPTICAL COMPONENT PACKAGE AND DEVICE USING SAME

(71) Applicant: POINT ENGINEERING CO., LTD., Asan (KR)

(72) Inventors: Bum Mo Ahn, Suwon (KR); Seung Ho Park, Hwaseong (KR); Moon Hyun Kim, Ansan (KR)

(73) Assignee: POINT ENGINEERING CO., LTD., Asan (KR)

( * ) Notice: Subject to any disclaimer, the term of this patent is extended or adjusted under 35 U.S.C. 154(b) by 27 days.

(21) Appl. No.: 17/351,019

(22) Filed: Jun. 17, 2021

(65) Prior Publication Data

US 2021/0313491 A1 Oct. 7, 2021

Related U.S. Application Data

(63) Continuation of application No. 16/738,827, filed on Jan. 9, 2020, now Pat. No. 11,069,839.

(30) Foreign Application Priority Data

May 14, 2019 (KR) ........................ 10-2019-0056518

(51) Int. Cl.
| | |
|---|---|
| *H01L 33/48* | (2010.01) |
| *H01L 33/58* | (2010.01) |
| *H01L 33/62* | (2010.01) |
| *H01L 33/64* | (2010.01) |

(52) U.S. Cl.
CPC ............ *H01L 33/486* (2013.01); *H01L 33/58* (2013.01); *H01L 33/62* (2013.01); *H01L 33/647* (2013.01); *H01L 2924/12041* (2013.01); *H01L 2933/0033* (2013.01)

(58) Field of Classification Search
None
See application file for complete search history.

(56) References Cited

U.S. PATENT DOCUMENTS

| | | | |
|---|---|---|---|
| 2006/0012299 A1* | 1/2006 | Suehiro | .................. H01L 33/56 257/E33.059 |
| 2008/0191236 A1* | 8/2008 | De Graaf | .............. F28D 15/043 257/714 |
| 2011/0134637 A1* | 6/2011 | Lin | ........................ F21V 29/70 362/249.02 |

(Continued)

FOREIGN PATENT DOCUMENTS

| | | | |
|---|---|---|---|
| KR | 101010866 B1 | 1/2011 | |
| KR | 101192183 B1 | 10/2012 | |

*Primary Examiner* — Bo B Jang (57) ABSTRACT

An optical component package includes a main substrate including a plurality of metal bodies, and a vertical insulation part provided between the metal bodies; a cavity provided in an upper surface of the main substrate; a sub-substrate provided in the cavity of the main substrate, the sub-substrate including an insulating body, a plurality of via holes vertically passing through the insulating body and filled with a metal material being electrically connected to each of the metal bodies, and a plurality of metal pads mounted on the insulating body and electrically connected to the plurality of via holes; a plurality of optical components mounted on the plurality of metal pads and electrically connected to the plurality of metal pads; and a light transmitting member provided above the main substrate.

7 Claims, 11 Drawing Sheets

(56) References Cited

U.S. PATENT DOCUMENTS

| | | | | |
|---|---|---|---|---|
| 2013/0301257 A1* | 11/2013 | Britt | ............ | H01L 25/0753 |
| | | | | 362/249.02 |
| 2015/0153034 A1* | 6/2015 | Miyairi | ............ | F21V 29/70 |
| | | | | 362/235 |

* cited by examiner

OPTICAL COMPONENT PACKAGE AND DEVICE USING SAME

CROSS REFERENCE TO RELATED APPLICATION

The present application is a continuation of U.S. patent application Ser. No. 16/738,827, filed Jan. 9, 2020, and claims priority to Korean Patent Application No. 10-2019-0056518, filed May 14, 2019, the entire contents of which is incorporated herein for all purposes by this reference.

BACKGROUND OF THE INVENTION

Field of the Invention

The present invention relates generally to an optical component package and a device using the same. More particularly, the present invention relates to an optical component package including a sub-substrate having a size conforming to a cavity of a substrate, and to a device using the same.

Description of the Related Art

Semiconductor optical components such as LEDs (light emitting diodes) are used in various industrial fields. An LED, which is a typical optical component that produces light by recombination of electrons and holes in the boundary region between a p-type semiconductor layer and an n-type semiconductor layer, is used in various fields depending on the wavelength of the produced light.

Criteria for determining device characteristics of such an LED include color, luminance, luminance intensity, thermal and electrical reliability, and the like. The device characteristics are primarily determined by a compound semiconductor material in an LED chip, but are also greatly influenced by the structure of a package for mounting the LED chip, which is a secondary factor.

For example, a UV LED for emitting ultraviolet light may emit a greater amount of ultraviolet light as the number of UV LEDs provided in a package increases. Regarding as an example of an LED package including a plurality of LED chips, a patent disclosed in Korean Patent No. 10-1192183 (hereinafter, referred to as "Related Art 1") is known.

In an LED package of Related Art 1, a plurality of metal substrates are sequentially coupled to each other, with an insulating layer interposed between each of the substrates to provide electrical insulation between the substrates, and an LED chip is mounted on each of the metal substrates.

However, the LED package of Related Art 1 as described above requires a plurality of insulating layers in order to mount a plurality of LED chips in a plurality of series connection structures on a metal substrate. That is, when only one insulating layer is provided on the metal substrate, there is a problem in that the plurality of LED chips may not be sequentially provided in series.

In other words, in order for the LED package of Related Art 1 to have the plurality of LED chips electrically in series, the plurality of insulating layers have to be formed in a structure that combine the plurality of metal substrates.

In addition, the plurality of LED chips have to be individually mounted after each metal substrate is combined, and thus there is a disadvantage in that a large manufacturing time of the LED package is required.

Recently, in an effort to solve the above problems, an LED package that further includes a separate sub-substrate on a metal substrate has been used. The sub-substrate of the LED package is formed in a structure that is mounted on any one of metal substrates divided by insulating layers, while being electrically connected to another metal substrate through a wire.

However, the LED package including the sub-substrate as described above has to include a wire mounting surface, and thus the sub-substrate has to be provided only in a portion of a cavity of the metal substrate. That is, the sub-substrate provided on the metal substrate is limited in increasing size, and accordingly, there is a disadvantage in that the number of LED chips mounted on the sub-substrate is inevitably reduced.

UV LEDs, on the other hand, have the advantages of relatively low power consumption, no generation of hazardous substances, and these are used in curing and sterilizing devices. However, if energy that cannot be converted into light when driving LEDs remains in the LEDs as heat, this may cause the performance, efficiency, and lifetime of the LEDs to be deteriorated.

Conventionally, LED cooling devices are used to compensate for the above disadvantage. Regarding as an example of the cooling devices, a patent disclosed in Korean Patent No. 10-1010866 (hereinafter, referred to as "Related Art 2") is known.

A UV LED module cooling device of Related Art 2 includes a cooling block including a refrigerant line in a lower portion of a substrate on which UV LEDs are mounted, thus having an effect of lowering the temperature of the UV LEDs.

However, Related Art 2 is a device that requires a cooling block that is a separate heat dissipation device in addition to the substrate on which the LEDs are mounted. That is, a space for providing a device for heat dissipation of the LEDs is required, and accordingly, there is a problem in that the size of an LED package increases thereby.

The foregoing is intended merely to aid in the understanding of the background of the present invention, and is not intended to mean that the present invention falls within the purview of the related art that is already known to those skilled in the art.

DOCUMENTS OF RELATED ART (Patent document 1) Korean Patent No. 10-1192183
(Patent document 2) Korean Patent No. 10-1010866

SUMMARY OF THE INVENTION

Accordingly, the present invention has been made keeping in mind the above problems occurring in the related art, and an objective of the present invention is to provide an optical component package including a sub-substrate having a size conforming to a cavity of a substrate, and to provide a device using the same.

Another objective of the present invention is to provide an optical component package for mounting a plurality of optical components in a flip chip form, and to provide a device using the same.

Still another objective of the present invention is to provide an optical component package capable of dissipating heat of optical components without requiring provision of a separate space, and to provide a device using the same.

In order to achieve the above objectives, according to one aspect of the present invention, there is provided an optical component package, including: a main substrate including a plurality of metal bodies, and a vertical insulation part provided between the metal bodies; a sub-substrate provided in a cavity of the main substrate, and electrically connected to each of the metal bodies with the vertical insulation part interposed therebetween; an optical component mounted on the sub-substrate; and a light transmitting member provided above the optical component, wherein the sub-substrate includes: an insulating body; a via hole vertically passing through the insulating body, and filled with a metal material; and a metal pad connected to the optical component.

Furthermore, the sub-substrate may include a plurality of metal pads and may be electrically connected to a plurality of optical components, and the plurality of metal pads and the plurality of optical components may be connected in series to each other.

Furthermore, the sub-substrate may include a plurality of metal pads and may be electrically connected to a plurality of optical components, and the plurality of metal pads and the plurality of optical components may be connected in parallel to each other.

Furthermore, the sub-substrate may include a plurality of metal pads and may be electrically connected to a plurality of optical components, and the plurality of metal pads and the plurality of optical components may be connected in series-parallel to each other.

Furthermore, a plurality of plating layers may be provided on the metal bodies, and the plating layers may be electrically connected to different via holes, respectively.

Furthermore, the plating layers may be partially exposed outside the sub-substrate, and a Zener diode may be mounted on exposed portions of the plating layers.

Furthermore, the main substrate may include a through hole horizontally passing through the metal bodies.

According to another aspect of the present invention, there is provided a device using an optical component package, the device including: a main substrate including a plurality of metal bodies, and a vertical insulation part provided between the metal bodies; a sub-substrate provided in a cavity of the main substrate, and electrically connected to each of the metal bodies with the vertical insulation part interposed therebetween; an optical component mounted on the sub-substrate; and a reservoir provided on the main substrate, accommodating a fluid, and including a light transmitting part provided at a position corresponding to the optical component, wherein the sub-substrate includes: an insulating body; a via hole vertically passing through the insulating body, and filled with a metal material; and a metal pad connected to the optical component.

Furthermore, the main substrate may include a through hole horizontally passing through the metal bodies.

Furthermore, the reservoir may include an input hole formed in a side wall thereof, and the input hole and the through-hole communicate with each other through a connection pipe.

As described above, the optical component package and the device using the same according to the present invention can include the sub-substrate having a size conforming to the cavity of the substrate.

Furthermore, it is possible to mount the plurality of optical components in a flip chip form.

Furthermore, it is possible to dissipate heat of the optical components without requiring provision of a separate space.

Furthermore, it is possible to reuse the fluid required for heat dissipation.

BRIEF DESCRIPTION OF THE DRAWINGS

The above and other objectives, features, and other advantages of the present invention will be more clearly understood from the following detailed description when taken in conjunction with the accompanying drawings, in which.

DETAILED DESCRIPTION OF THE INVENTION

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to such specially listed exemplary embodiments and the conditions.

The above described objectives, features, and advantages will be more apparent through the following detailed description related to the accompanying drawings, and thus those of ordinary skill in the art may easily implement the technical spirit of the invention.

Hereinafter, exemplary embodiments of the present invention will be described in detail with reference to the accompanying drawings.

Figure 1:
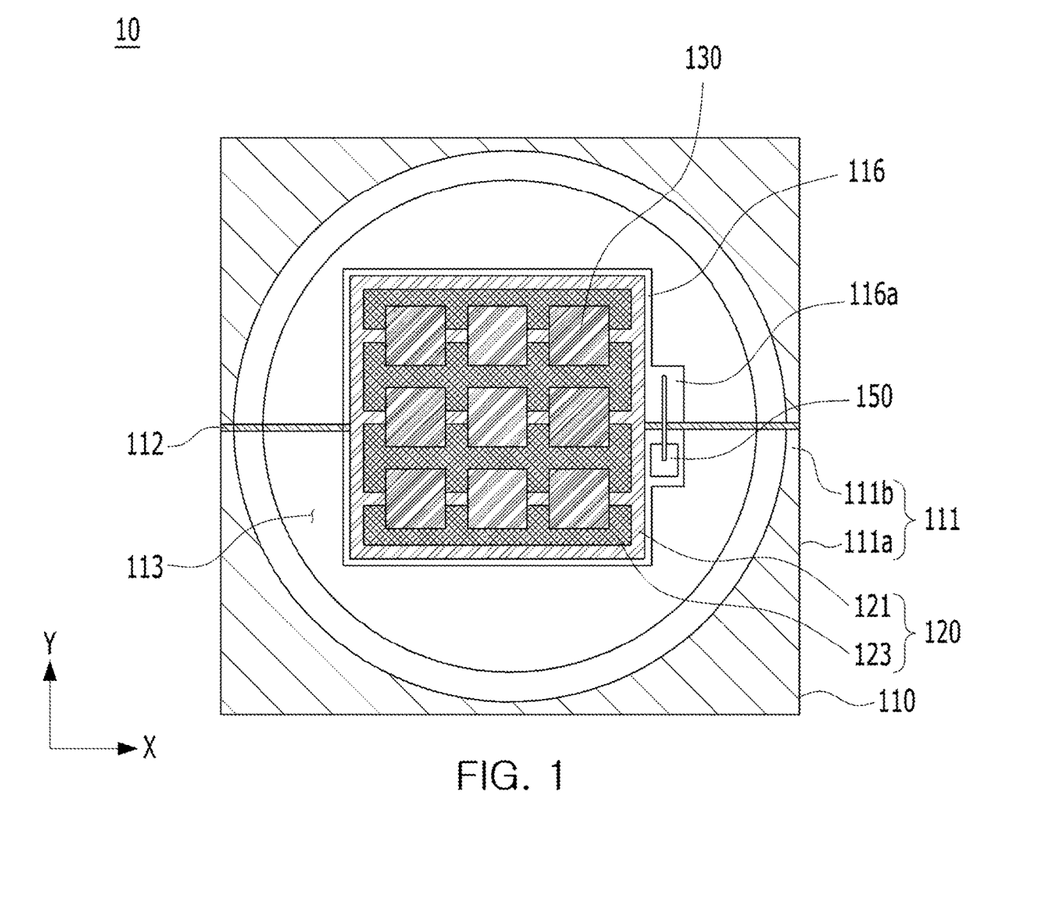
FIG. 1 is a plan view showing an optical component package according to an exemplary embodiment of the present invention.
Figure 2:
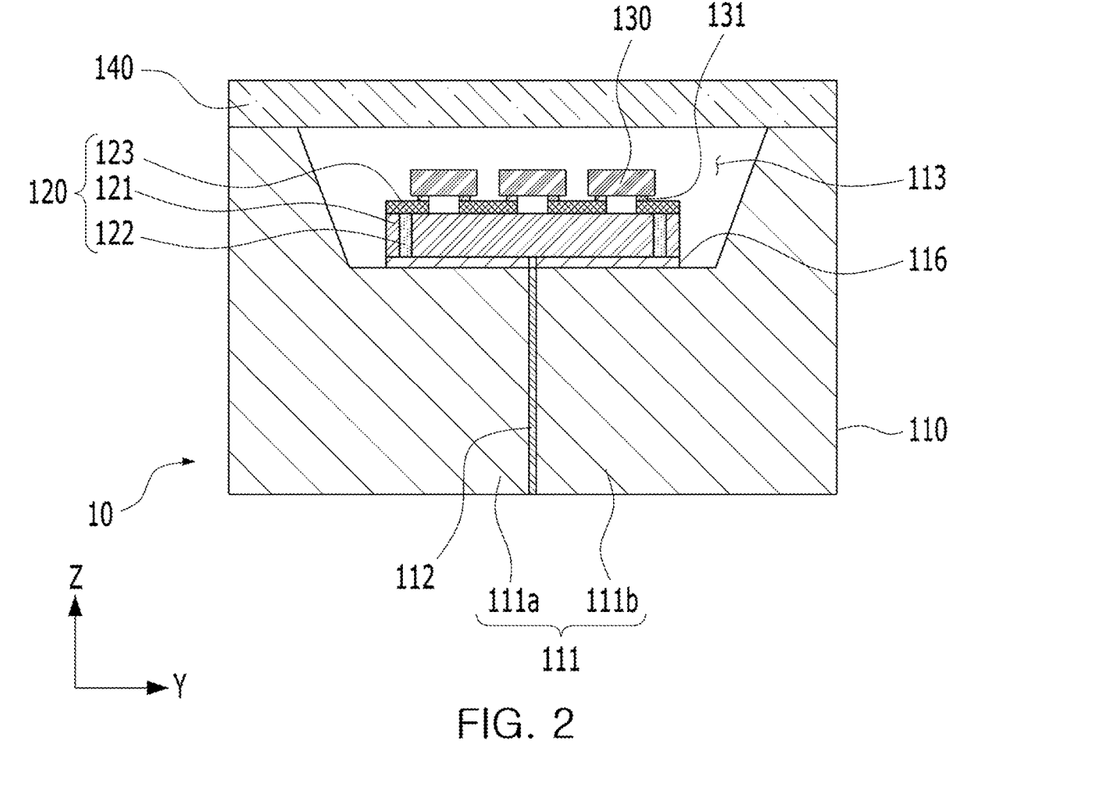
FIG. 2 is a sectional view showing the optical component package of FIG. 1.
Figure 3:
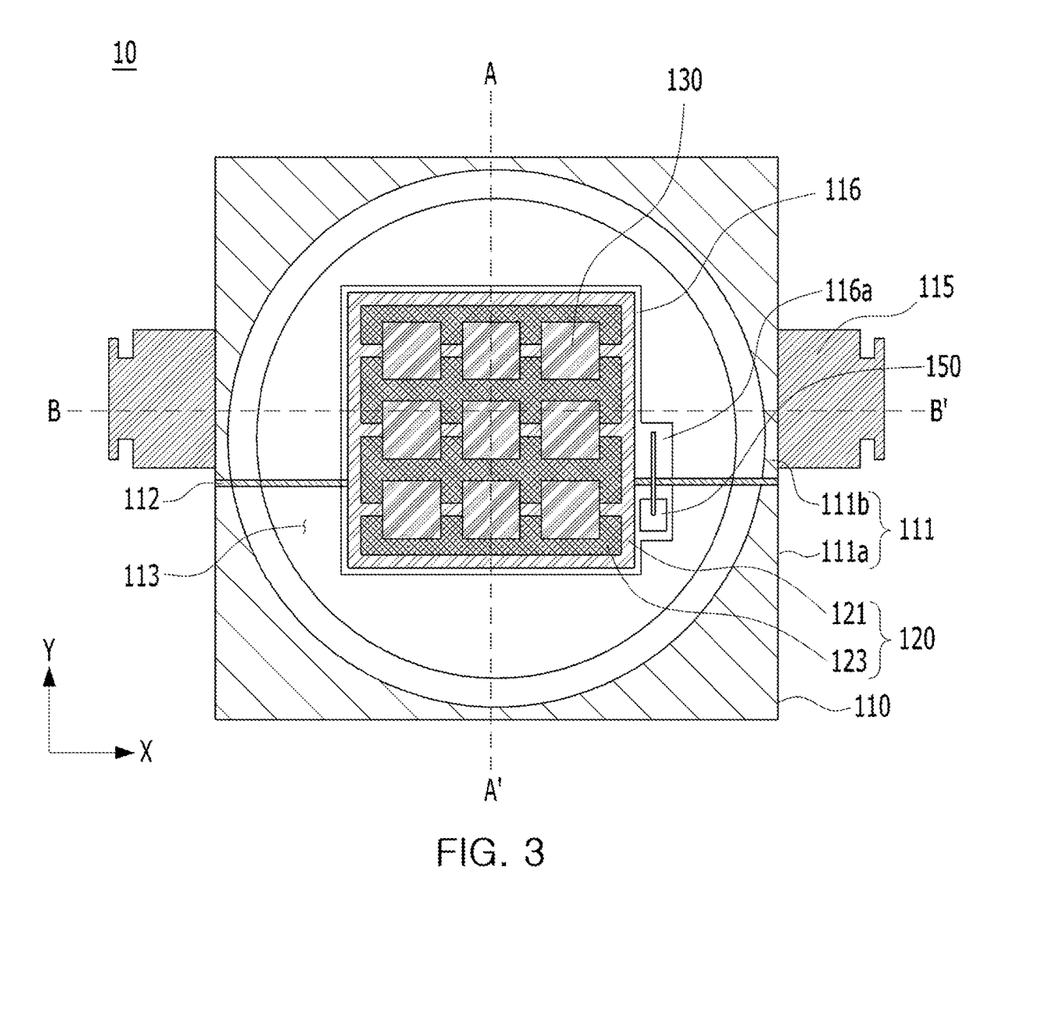
FIG. 3 is a plan view showing a modification of FIG. 1.
Figure 4:
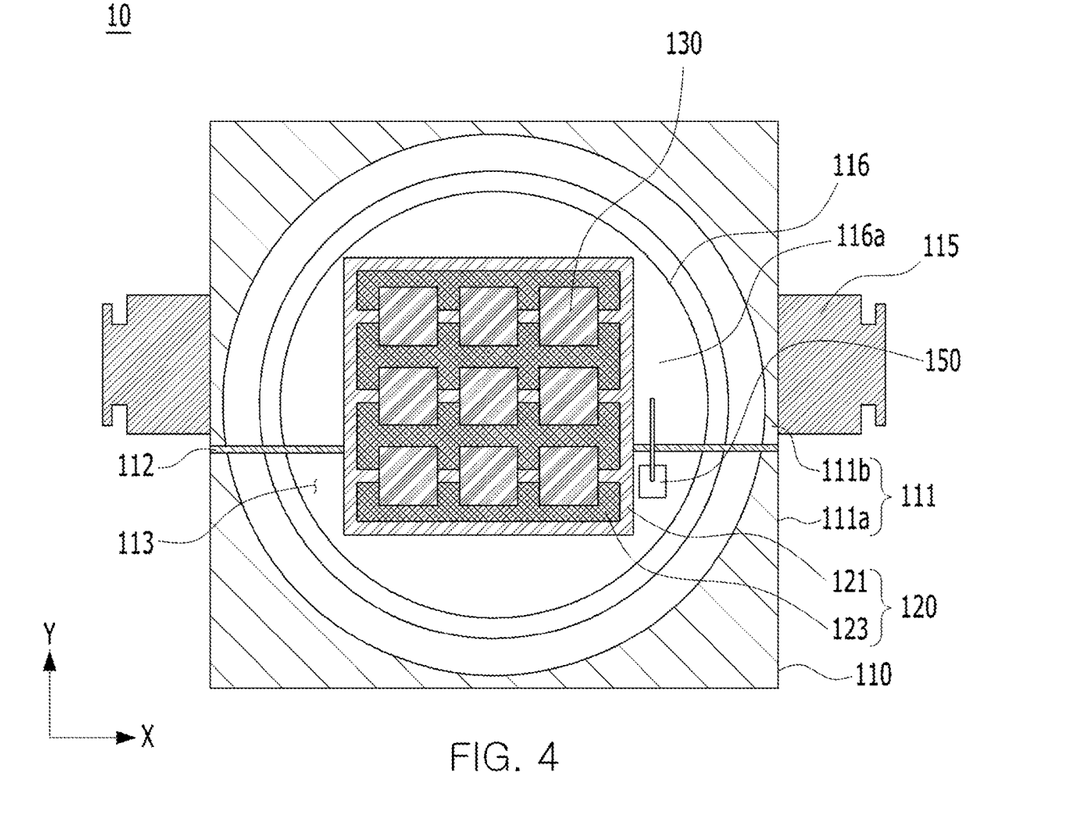
FIG. 4 is a plan view showing a modification of FIG. 1.
Figure 5:
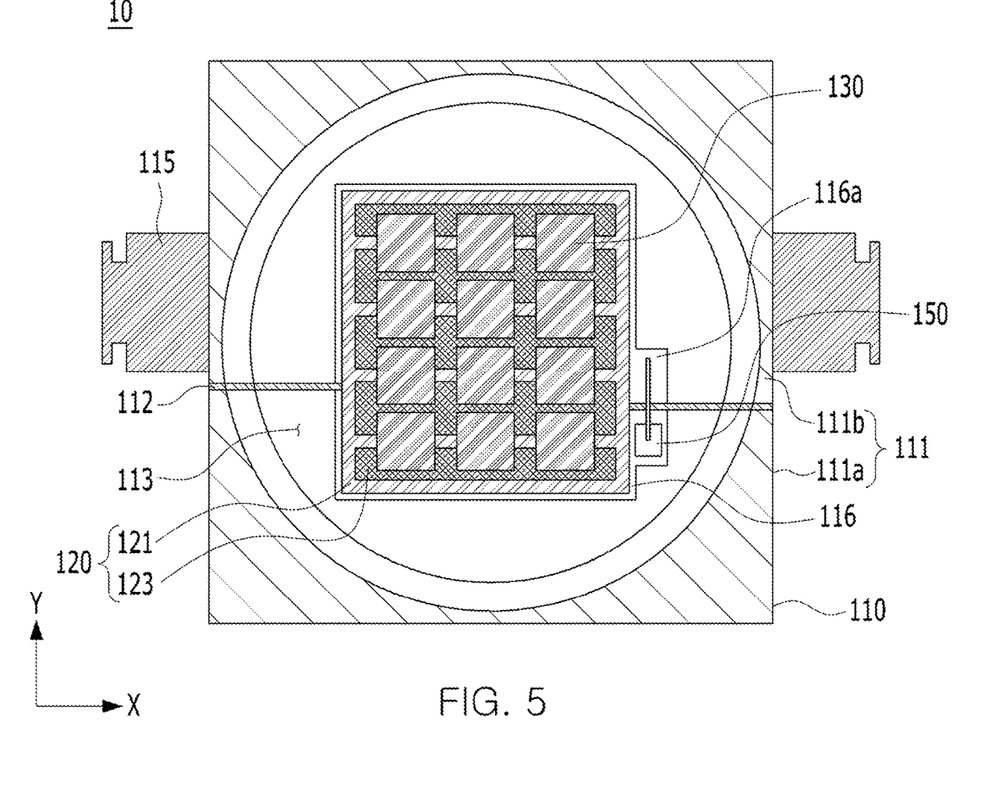
FIG. 5 is a plan view showing a modification of FIG. 1.
Figure 6:
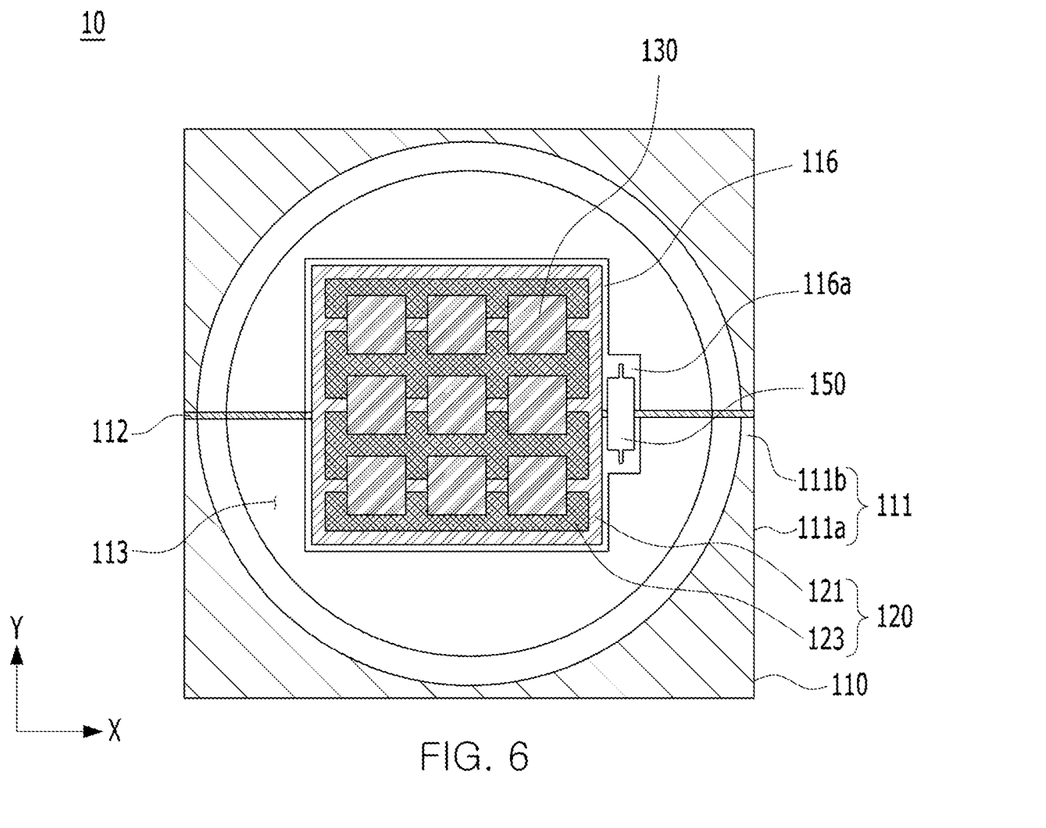
FIG. 6 is a plan view showing a modification of FIG. 1.

FIG. 1 is a plan view showing an optical component package according to an exemplary embodiment of the present invention, FIG. 2 is a sectional view showing the optical component package of FIG. 1, FIG. 3 is a plan view showing a modification of FIG. 1, FIG. 4 is a plan view showing a modification of FIG. 1, FIG. 5 is a plan view showing a modification of FIG. 1, and FIG. 6 is a plan view showing a modification of FIG. 1.

Referring to FIGS. 1 to 6, an optical component package 10 includes a main substrate 110, a sub-substrate 120 provided at the main substrate 110, an optical component 130 mounted on the sub-substrate 120, and a light transmitting member 140 provided above the main substrate 110, the sub-substrate 120, and the optical component 130.

The main substrate 110 includes a plurality of metal bodies 111 and a vertical insulation part 112 provided between the metal bodies 111. In the present embodiment, it will be described as an example that the main substrate 110 includes two metal bodies 111 and one vertical insulation part 112. However, the configuration of the main substrate 110 is not limited thereto. For example, the main substrate 110 may include three metal bodies 111 and two vertical insulation parts 112.

The metal bodies 111 may be made of a metal plate having excellent electrical conductivity and thermal conductivity. For example, the metal bodies 111 may be made of any one selected from aluminum, an aluminum alloy, copper, a copper alloy, iron, an iron alloy, and equivalents thereof, but the present invention is not limited thereto.

The vertical insulation part 112 is disposed vertically between the metal bodies 111 and serves to electrically insulate a first metal body 111a and a second metal body 111b and to join the first metal body 111a and the second metal body 111b. Accordingly, the first metal body 111a and the second metal body 111b are electrically insulated from each other by the vertical insulation part 112, whereby different voltages may be applied to the first metal body 111a and the second metal body 111b. For example, a positive (+) voltage may be applied to the first metal body 111a provided on the left side on the drawings, while a negative (−) voltage may be applied to the second metal body 111b provided on the right side on the drawings.

The vertical insulation part 112 may be made of any one selected from a conventional insulating sheet, benzocyclobutene (BCB), bismaleimide trizine (BT), polybenzoxazole (PBC)), polyimide (PI), phenolicresin, epoxy, silicone, and equivalents thereof, but the present invention is not limited thereto.

The vertical insulation part 112 may be formed in a shape extending in an X-axis direction at the center of the metal bodies 111 (see FIG. 1), or in a shape extending in the X-axis direction at a position deviated from the center of the metal bodies 111 (see FIG. 3). In other words, when the plurality of metal bodies 111a and 111b have the same size, the vertical insulation part 112 may be formed at the center of the metal bodies 111. On the contrary, when the plurality of metal bodies 111a and 111b have different sizes, the vertical insulation part 112 may be formed at a position eccentric to any one of the metal bodies 111.

A cavity 113 may be formed in one side of the metal bodies 111. The cavity 113 may be formed in a tapered shape in which the width thereof gradually decreases downward. The sub-substrate 120 may be provided in the cavity 113. In detail, the cavity 113 may be formed to have a larger size than the sub-substrate 120, and the sub-substrate 120 may be provided at one side in the cavity 113.

Figure 7:
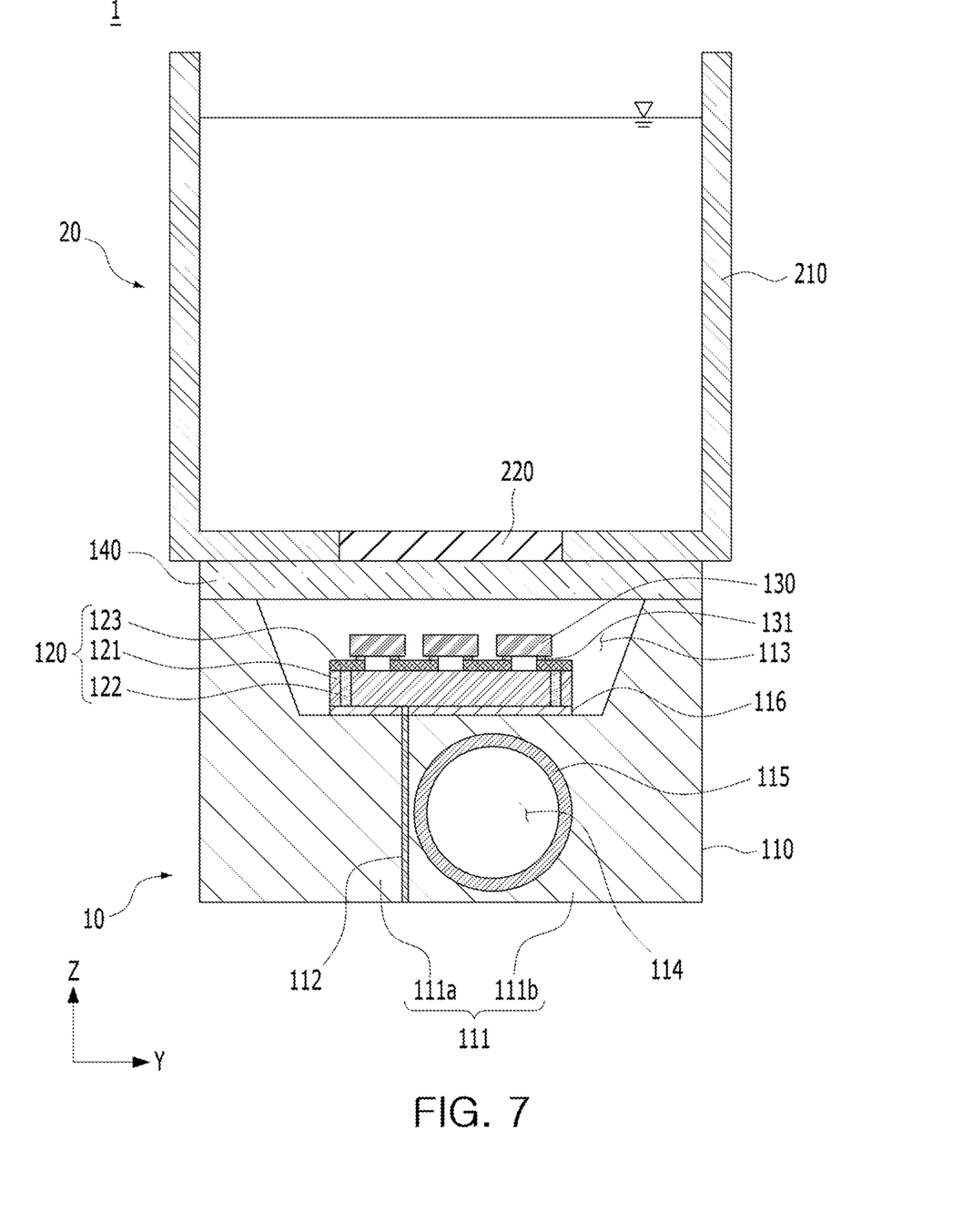
FIG. 7 is a sectional view showing a device using an optical component package taken along line A-A' in FIG. 3.

The main substrate 110 includes a through hole 114 (see FIG. 7). The through hole 114 horizontally passes through any one metal body 111 of the plurality of metal bodies 111. The through hole 114 may include connection members 115 for connection of a connection pipe 250 which will be described later. Herein, the connection members 115 may be provided as couplers for fixing the connection pipe 250.

In detail, the through hole 114 may have a shape extending in the same direction as the extending direction of the vertical insulation part 112. That is, the through hole 114 may be formed in a shape extending in the X-axis direction.

The through hole 114 may be provided at one side of any one of the first metal body 111a and the second metal body 111b, and preferably, at one side of the second metal body 111b to which the negative (−) voltage is applied.

Furthermore, when the vertical insulation part 112 is formed at the position eccentric to one of the metal bodies 111 rather than at the center thereof, the through hole 114 may be formed at a metal body 111 having a relatively large size among the plurality of metal bodies 111. The specific role of the through hole 114 will be described later.

A plating layer 116 is formed on the metal body 111. The plating layer 116 is for providing electrical connection between the metal bodies 111 and the sub-substrate 120, and may be formed on each of the plurality of metal bodies 111. Herein, the plating layer 116 may be located on upper surfaces of the metal bodies 111 at a position that does not overlap with the vertical insulation part 112.

The plating layer 116 may be formed in a size conforming to that of the sub-substrate 120, and may be formed larger in the size than the sub-substrate 120. That is, the sub-substrate 120 may include a protrusion 116a which defines a portion of the plating layer 116 at one side of the sub-substrate. When the sub-substrate 120 is provided in the cavity 113, the protrusion 116a of the plating layer 116 may be exposed outside the sub-substrate 120. In detail, the plating layer 116 may include two mounting regions. In more detail, the sub-substrate 120 may be divided into a first mounting region in which the sub-substrate 120 is mounted, and a second mounting region which defines the protrusion 116a. Herein, the first and second mounting regions may be provided as two regions, with the vertical insulation part 112 interposed therebetween.

As shown in FIGS. 1 and 3, the plating layer 116 may be formed to have a quadrangular cross-section, with an area larger than that of the sub-substrate 120, such that the edge portion of the plating layer 116 may be externally exposed even after the sub-substrate 120 is mounted. Furthermore, the plating layer 116 may be formed in a shape in which one side thereof protrudes. That is, the protrusion 116a of the plating layer 116 may be exposed outside the sub-substrate 120.

The shape of the plating layer 116 is not limited to this. For example, the plating layer 116 may be formed in a shape having an arc as shown in FIG. 4. In detail, the plating layer 116 may be formed on a bottom surface of the cavity 113 in a circular shape conforming to the shape of the bottom surface of the cavity 113, and may be divided into two plating layers 116 with respect to the vertical insulation part 112. That is, both the two plating layers 116 may have a shape having an arc. Herein, a plating layer 116 formed on the second metal body 111b in which the through hole 114 may be formed larger in size than a remaining plating layer 116 formed on the first metal body 111a.

When the plating layers 116 are formed in a shape having an arc, a region beyond the sub-substrate 120 may define the protrusion 116a of each of the plating layers 116. That is, when the sub-substrate 120 is mounted on the main substrate 110, a region of each of the plating layers 116 exposed outside the sub-substrate 120 may define the protrusion 116a.

The plating layers 116 may be made of a gold, silver, or copper material having high electrical conductivity, but the material of the plating layers 116 is not limited thereto.

The sub-substrate 120 is provided in the cavity 113 of the main substrate 110. The sub-substrate 120 is electrically connected to the metal bodies 111 and includes an insulating body 121, a via hole 122 vertically passing through the insulating body 121, and a metal pad 123 connected to the optical component 130.

It is preferable that the insulating body 121 is made of a silicon material. The insulating body 121 may be formed to have a predetermined height, with a plurality of via holes 122 formed therein.

The insulating body 121 may be provided on the plating layers 116, and may be joined thereto by bonding with an adhesive means. However, the joining method of the insulating body 121 and the plating layers 116 is not limited thereto.

The insulating body 121 may include the plurality of via holes 122 formed therein. The via holes 122 may be filled with a metal material. For example, the via holes 122 may be filled with gold, silver, copper, or tungsten as a conductive material.

In detail, the via holes 122 may be provided in the same number as the metal bodies 111, and the respective via holes 122 may be electrically connected to the different metal bodies 111. Due to the fact that the via holes 122 and the metal bodies 111 are connected to each other, respectively, all the insulating bodies 121 may be electrically connected to the plurality of metal bodies 111.

In the present embodiment, described that the via holes 122 are vertically formed in a Z-axis direction, but the shape of the via holes 122 is not limited thereto. For example, the via holes 122 may be formed in a shape inclined at a predetermined angle with respect to an upper or lower surface of the insulating body 121.

The via holes 122 are formed in a shape passing through the insulating body 121. Herein, upper sides of the via holes 122 are connected to the metal pad 123 which will be described later, while lower sides of the via holes 122 are electrically connected to the metal layer 116. Accordingly, the voltage of the metal layer 116 may be transferred to the metal pad 123 through the via holes 122. The configuration of the via holes 122 is to join the sub-substrate 120 to the main substrate 110 in a flip chip form. The sub-substrate 120 may be electrically connected to the main substrate 110 through wire bonding without separate provision of the via holes 122. However, a connection configuration through wire bonding requires a separate bonding region that is formed in the plating layers 116 or the metal bodies 111, and thus there is a limitation in increasing the size of the sub-substrate 120.

A plurality of metal pads 123 are provided on the upper surface of the insulating body 121. The metal pads 123 may be configured such that a portion thereof is connected to the via holes 122, and accordingly, the metal pads 123 may be electrically connected to the metal bodies 111. In detail, the plurality of metal pads 123 may be provided on the upper surface of the insulating body 121 to be parallel to the vertical insulation part 112, and may be connected to the optical component 130. For example, four metal pads 123 may be arranged in a spaced-apart relationship at a predetermined interval, and two peripheral metal pads 123 may be connected to the via holes 122, respectively. Accordingly, currents flowing through the via holes 122 may be applied to the metal pads 123, respectively. Herein, the metal pads 123 may be formed to have different sizes. For example, two central metal pads 123 may be formed to have a larger size than the two peripheral metal pads 123. However, the shape of the metal pads 123 is not limited thereto, and the metal pads 123 may be formed in the same size.

In other words, the two peripheral metal pads 123 among the metal pads 123 are respectively connected to the via holes 122 connected to the different metal bodies 111. The voltage transferred to the two peripheral metal pads 123 may be transferred to the central metal pads 123 through the optical component 130. The transfer of the voltage through the optical component 130 will be described later.

The optical component 130 is mounted on the sub-substrate 120. The optical component 130 is a device that emits light in response to application of the voltage of the main substrate 110 through the sub-substrate 120, and may be an LED. In detail, the optical component 130 may be provided as a UV LED for emitting ultraviolet (UV) light.

The optical component 130 may include two electrodes 131, and may be mounted in a flip chip form on the sub-substrate 120. Herein, the electrodes 131 may be electrically connected to the different metal pads 123, respectively.

In detail, when the four metal pads 123 are provided on the sub-substrate 120 as shown in FIGS. 1, 3, and 4, nine optical components 130 may be provided in a spaced-apart relationship at a predetermined interval. A plurality of optical components 130 may be connected to the metal pads 123. For example, three optical components 130 may be connected to one metal pad 123.

Furthermore, six optical components 130 may be connected to the metal pads 123. For example, three optical components 130 may be connected to each of the peripheral metal pads 123, and six optical components 130 may be connected to each of the central metal pads 123. Herein, the electrodes 131 of each of the optical component 130 may be connected to adjacent metal pads 123, respectively, and thus each of the optical components 130 may be simultaneously connected to two metal pads 123. In other words, the metal pads 123 and the optical components 130 may be connected in series, parallel, or series-parallel.

Referring to FIG. 3, the positive (+) voltage of the first metal body 111a may be applied to a leftmost metal pad 123 through one of the via holes 122, and the negative (−) voltage of the second metal body 111b may be applied to a rightmost metal pad 123 through the other one of the via holes 112. Accordingly, the positive (+) voltage may be applied to a plurality of optical components 130 provided at the leftmost metal pad, and the negative (−) voltage may be applied to a plurality of optical components 130 provided at the rightmost metal pad. Furthermore, the optical components 130 may transfer received currents to the other side metal pads 123. That is, different voltages may flow along the metal pads 123 and the optical components 130, and the optical components 130 may produce UV light in response to the application of the different voltages.

Furthermore, as shown in FIG. 5, when five metal pads 123 are provided on the sub-substrate 120, twelve optical components 130 may be provided in a spaced-apart relationship at a predetermined interval. Herein, three optical components 130 in the X-axis direction may be electrically connected in parallel to each other, and while four optical components 130 in the Y-axis direction may be electrically connected in series to each other. Accordingly, the five metal pads 123 may be provided in a spaced-apart relationship at a predetermined interval.

In other words, the five metal pads 123 may be provided on the insulating body 121, and the twelve optical components 130 may be mounted on the metal pads 123. In the present embodiment, it is described as an example that the nine or twelve optical components 130 are mounted on the metal pads 123, but the number of mounting of the optical components 130 is not limited thereto.

The optical components 130 are mounted in the cavity 113 having a tapered shape in which the width thereof gradually decreases downward. Herein, due to the tapered shape of the cavity 113 of which the width gradually decreases downward, the cavity 113 may include an inclined surface (not shown). Accordingly, the inclined surface may function to reflect the UV light emitted from the optical components 130.

The light transmitting member 140 is provided above the optical components 130. The light transmitting member 140 may be provided in a structure covering the cavity 113, and may be made of a transparent material such that the UV light emitted from the optical components 130 may be transmitted therethrough. For example, the light transmitting member 140 may be made of a quartz material, but the material of the light transmitting member 140 is not limited thereto.

Meanwhile, a Zener diode 150 is mounted on the plating layers 116. The Zener diode 150 is a diode for obtaining a constant voltage and may be configured such that one side and the other side thereof are connected to the respective plating layers 116.

In detail, the Zener diode 150 may be provided in any one of the metal bodies 111, and may be electrically connected to a remaining one of the metal bodies 111 through a wire. That is, the Zener diode 150 may be connected to the plating layers 116 in a vertical form as shown in FIGS. 1, 3, 4, and 5. Herein, the Zener diode 150 may be mounted on the protrusions 116a of the plating layers 116. That is, the Zener diode 150 may be provided at a position that does not overlap with the sub-substrate 120.

The connecting method of the Zener diode 150 and the plating layers 116 is not limited thereto. For example, as shown in FIG. 6, a flip-type terminal may be provided such that one side of the Zener diode 150 is connected to the plating layer 116 provided on the first metal body 111a, and the other side of the Zener diode 150 is connected to the plating layer 116 provided on the second metal body 111b.

In other words, each of one and the other sides of the Zener diode 150 may be connected to the protrusion 116a of each of the plating layers 116 in a vertical form or flip chip form, and accordingly, one Zener diode 150 may be electrically connected to the two metal bodies 111 simultaneously. That is, due to the fact that the Zener diode 150 is mounted on the plating layers 116, the voltage transferred to the optical components 130 mounted on the sub-substrate 120 on the plating layers 116 can be kept constant. Therefore, a stable voltage can be transferred to the optical components 130.

Meanwhile, the sub-substrate may have a structure that is provided on one metal substrate, while being electrically connected to another metal substrate through a wire. That is, this may be a structure in which the optical components, the sub-substrate, and the main substrate are connected to each other in a vertical shape. Accordingly, the sub-substrate may be provided only at one side of the cavity of the main substrate. However, according to the configuration in which the optical component package 10 connects the optical components 130, the sub-substrate 120, and the main substrate 110 to each other in a flip chip form, the sub-substrate 120 may be provided in a size conforming to the size of the cavity 113 of the main substrate 110. That is, the size of the sub-substrate 120 is increased, and accordingly, there is an effect in that the number of optical components 130 mounted on the sub-substrate 120 is also increased.

Figure 8:
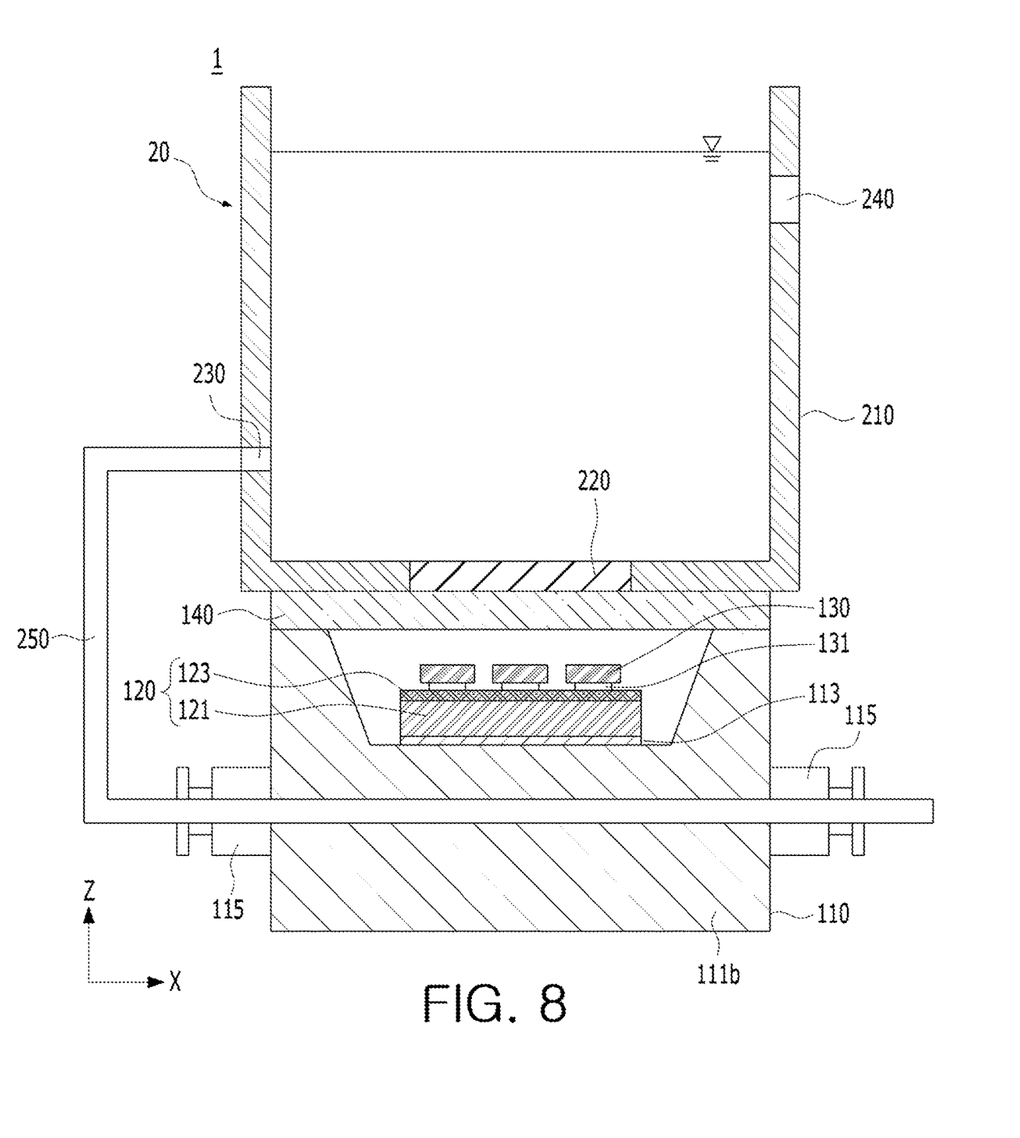
FIG. 8 is a sectional view showing the device using the optical component package taken along line B-B' in FIG. 3.
Figure 9:
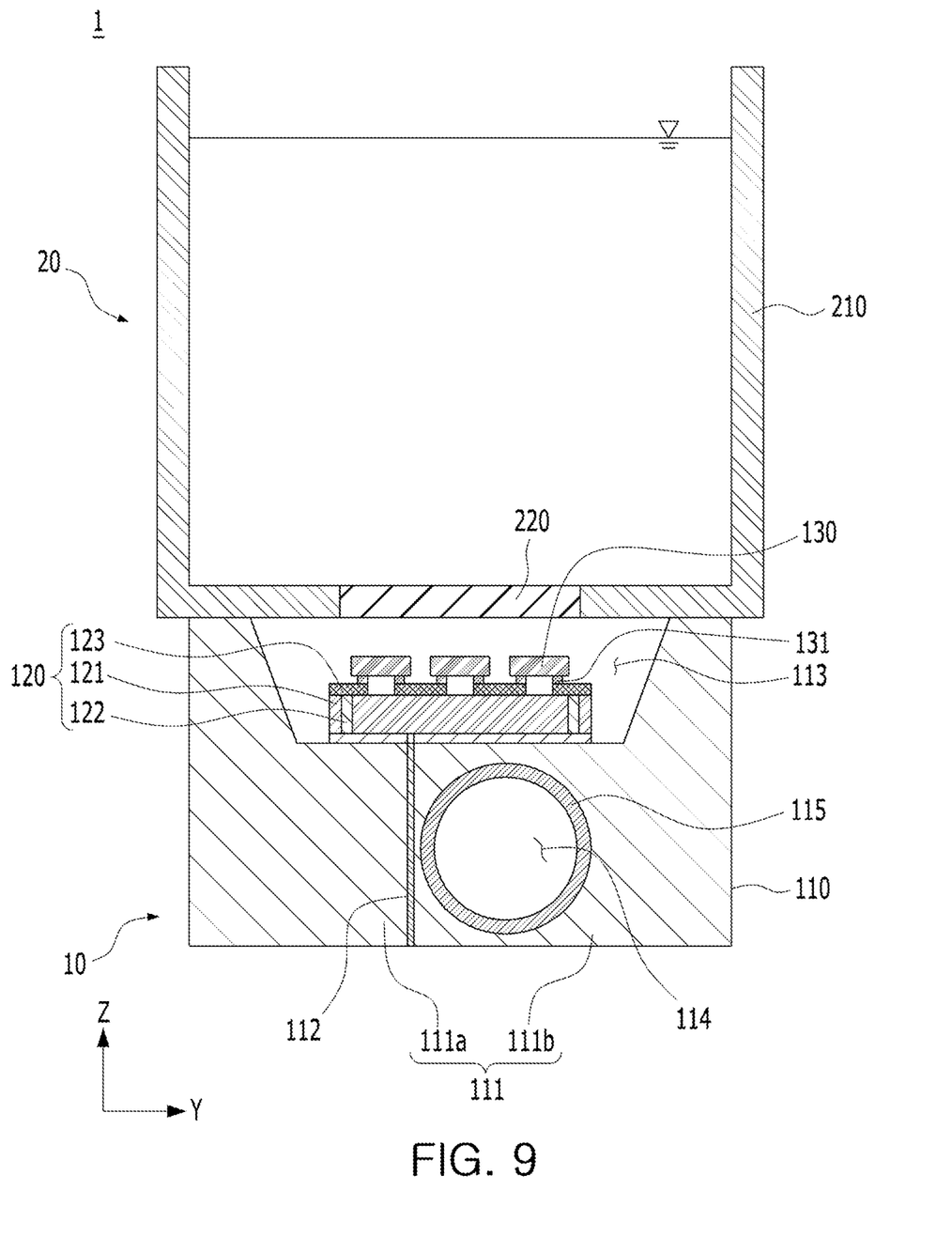
FIG. 9 is a plan view showing a modification of FIG. 7.
Figure 10:
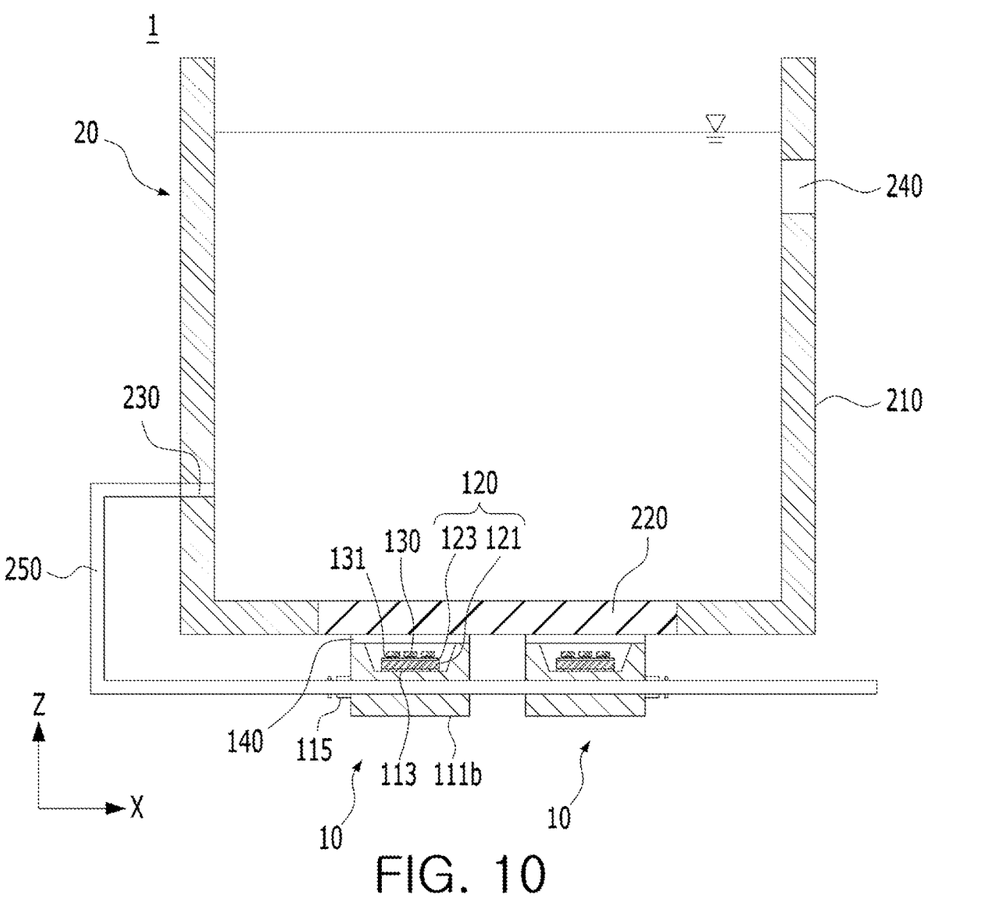
FIG. 10 is a plan view showing a modification of FIG. 8.

FIG. 7 is a sectional view showing a device using an optical component package taken along line A-A' in FIG. 3, FIG. 8 is a sectional view showing the device using the optical component package taken along line B-B' in FIG. 3, FIG. 9 is a plan view showing a modification of FIG. 7, and FIG. 10 is a plan view showing a modification of FIG. 8.

Referring to FIGS. 7 to 10, a device 1 (hereinafter, referred to as an "optical component device") using an optical component package includes an optical component package 10, and a reservoir 20 provided at a position corresponding to the optical component package 10. In the present embodiment, it will be described as an example that the optical component device 1 is a sterilizing device.

However, the type of the optical component device 1 is not limited to this, and various devices such as a curing device may be used.

The reservoir 20 is provided on the optical component package 10. The reservoir 20 contains a fluid that is sterilized through the optical component package 10 and includes a casing 210, a light transmitting part 220, an input hole 230, and a discharge hole 240.

The casing 210 accommodates a fluid therein, and may be located on the optical component package 10. For example, the casing 210 may be seated on the upper side of the light transmitting member 140. Herein, the light transmitting part 220 may be provided at one side of the casing 210 such that light emitted from optical components 130 is transmitted therethrough. The light transmitting part 220 may be provided at a position corresponding to the optical components 130, and may be made of a quartz material. In the present embodiment, it is described that the light transmitting part 220 is provided at one side of a lower portion of the casing 210, but the position of the light transmitting part 220 is not limited thereto. For example, the entire lower portion of the casing 210 may be defined as the light transmitting part 220.

The casing 210 may be located on metal bodies 111 as shown in FIG. 9. In other words, the light transmitting member 140 may not be provided between the optical components 130 and the reservoir 20. That is, the reservoir 20 may be seated in a structure covering a cavity 113. Herein, the casing 210 of the reservoir 20 may have a larger cross-section than the cavity 113 such that the cavity 113 may be closed through the reservoir 20.

Due to the fact that the reservoir 20 is provided above the optical components 130 without provision of a separate light transmitting member, UV light emitted from the optical components 130 can more effectively irradiate the reservoir 20.

As shown in FIGS. 7 to 9, one optical component package 10 may be provided on a lower surface of the reservoir 20, but the number of optical component package 10 is not limited thereto. For example, as shown in FIG. 10, two optical component packages 10 may be provided on the lower surface of one reservoir 20. When a plurality of optical component packages are provided, the optical component packages 10 may be provided such that the optical components 130 are provided at positions corresponding to the light transmitting part 220 of the reservoir 20. That is, all the optical components 130 included in each optical component package 10 may be provided at positions corresponding to the light transmitting part 220.

When the optical component device 1 is a sterilizing device, the inside of the casing 210 may be subjected to mirror finishing. Therefore, the UV reflectance inside the casing 210 can be increased, and accordingly, the sterilization effect of the fluid provided inside the casing 210 can be increased.

The input hole 230 and the discharge hole 240 may be formed in a side wall of the casing 210 of the reservoir 20. The input hole 230 provides a hole through which a fluid is introduced into the casing 210, and the discharge hole 240 provides a hole through which the fluid is discharged out of the casing 210. Herein, the connection pipe 250 may be coupled to the input hole 230.

The connection pipe 250 is in communication with the reservoir 20 and the optical component package 10, and may be configured such that one side thereof is connected to the input hole 230, and the other side thereof is connected to a connection member 115. Herein, two connection pipes 240 may be provided such that one connection pipe 250 is connected to one side of the connection member 115, and another connection pipe 250 is connected to the other side of the connection member 115. Alternatively, one connection pipe 250 may be provided, and the connection pipe 250 may have a structure passing through the inside of a through hole 114.

The fluid may be provided to the reservoir 20 after passing through the through hole 114 through the connection pipe 250. Herein, the fluid may be low-temperature water, but the type of the fluid is not limited thereto. For example, the fluid may be a low viscosity liquid other than low-temperature water.

Heat emitted from the optical components 130 may be transferred to a sub-substrate 120 on which the optical components 130 are mounted, and to a main substrate 110. That is, the main substrate 110 and the sub-substrate 120 may have a high temperature, and accordingly, the optical component package 10 may require a heat dissipation structure. Herein, when a low-temperature fluid moves along the through hole 114 passing through the main substrate 110, the temperature of the main substrate 110 is lowered due to the fluid. That is, the through hole 114 may serve as a refrigerant line.

The through hole 114 may be formed in a metal body 111 having a relatively large size among the metal bodies 111. In detail, a vertical insulation part 112 provided between the metal bodies 111 has low thermal conductivity and thus may prevent the low temperature of the fluid transferred from the metal body 111 on one side from being transferred to the metal body 111 on the other side. Accordingly, the vertical insulation part 112 is provided eccentrically to one side of the main substrate 110, and the through hole 114 is provided in the metal body 111 having a relatively large size, whereby the low temperature of the fluid provided from the through hole 114 can be transferred to more portions of the metal bodies 111. That is, the heat dissipation effect through the through hole 114 can be increased.

The fluid passing through the through hole 114 for heat dissipation of the main substrate 110 may be introduced into the casing 210 along the connection pipe 250. Therefore, when the optical component device 1 is a sterilizing device, the fluid used for heat dissipation of the optical component package 10 may be sterilized inside the casing 210 by the optical component package 10. That is, there is an effect in that the fluid that needs to be sterilized can be reused.

When the fluid is water, the fluid passing through the through hole 114 has polarity. Therefore, the metal bodies 111 may be charged when the fluid having polarity passes through the metal bodies 111 through which voltage flows. To prevent this, the through hole 114 may be subjected to insulation treatment and coating treatment. Herein, the through hole 114 may be coated with an oxide film, but the type of coating provided in the through hole 114 is not limited thereto. Herein, a negative (−) voltage may be applied to the metal body 111 in which the through hole 114 is formed such that the metal body 111 in which the through hole 114 is formed is provided as a ground electrode. In other words, the through hole 114 may be formed in a second metal body 111b to which the negative (−) voltage is applied.

When the through hole 114 is subjected to insulation treatment and coating treatment, there is a disadvantage in that the heat dissipation effect through the fluid is reduced. That is, a separate coating may not be provided in the through hole 114 in order to increase the heat dissipation effect.

An optical component package in the related art includes a separate heat dissipation structure for heat dissipation of the optical components 130. That is, the optical component package in the related art further requires a separate space for the heat dissipation structure. Therefore, there is a disadvantage in that the size of the optical component package is inevitably increased. However, the optical component package 10 according to the present invention is characterized by providing the through hole 114 at one side of the main substrate 110, thus allowing the low-temperature fluid to flow at one side of the main substrate 110. Accordingly, heat of the main substrate 110 of which the temperature is increased by the optical components 130 can be dissipated. That is, there is an effect of adding a heat dissipation structure without requiring provision of a separate space.

Furthermore, a fluid to be sterilized or cured through the optical component package 10 can be used for heat dissipation of the optical component package 10, whereby the fluid can be reused.

Hereinafter, another embodiment of the present invention will be described. It is to be noted that the following embodiment will be described on the basis of characteristic components compared to the exemplary embodiments of the present invention, and descriptions of the same or similar components as the exemplary embodiment will be omitted.

Figure 11:
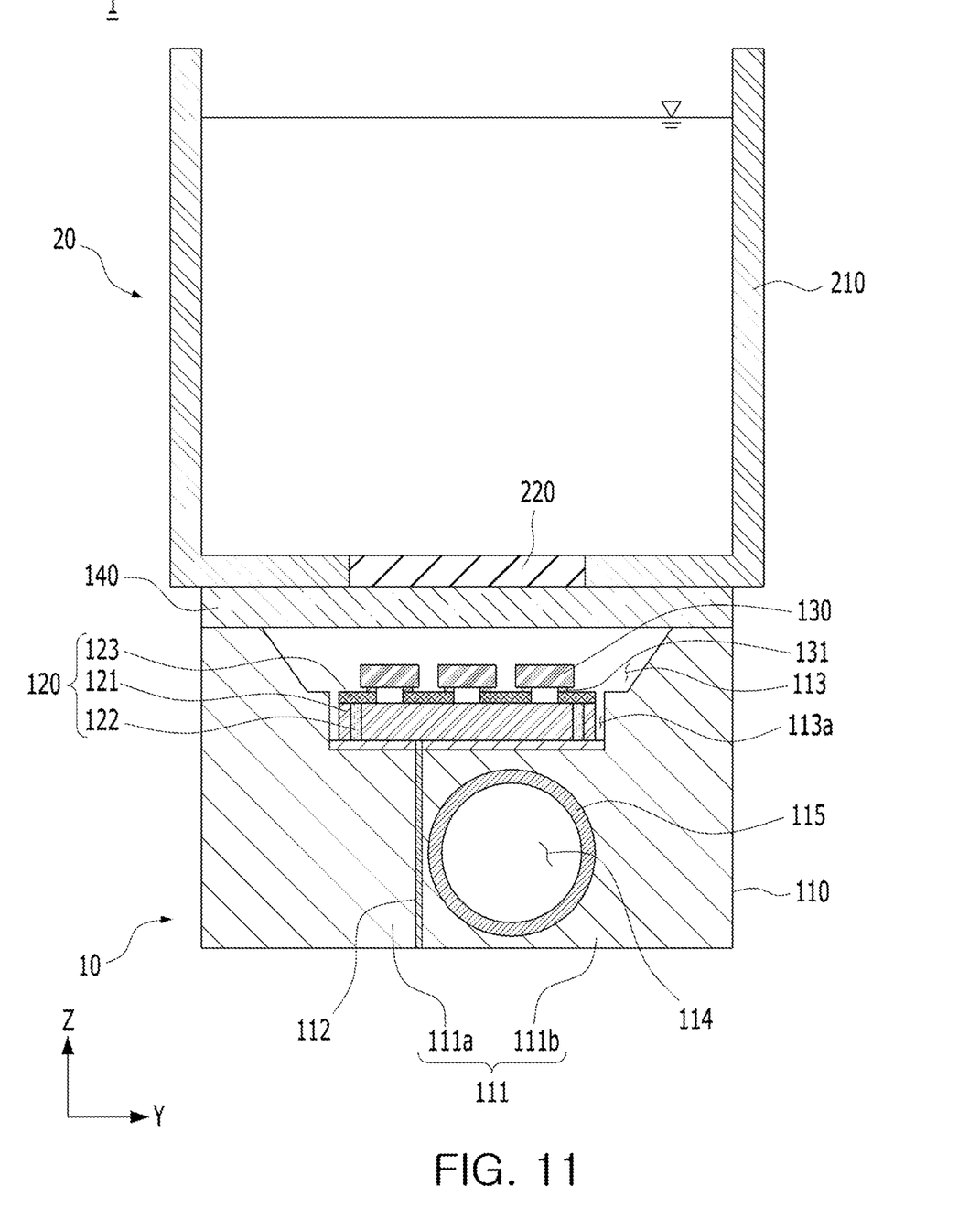
FIG. 11 is a sectional view showing a device using an optical component package according to another embodiment of the present invention.

FIG. 11 is a sectional view showing a device using an optical component package according to another embodiment of the present invention.

Referring to FIG. 11, a cavity 113 may be formed in one side of multiple metal bodies 111, and an installation recess 113a conforming to the size of a sub-substrate 120 may be formed at one side of the cavity 113. In detail, the cavity 113 may be formed in the center of upper surfaces of the metal bodies 111, and the installation recess 113a having a predetermined height may be formed by extending downward from the center of the cavity 113. Herein, the cavity 113 has a tapered shape configured such that the width thereof gradually decreases downward.

In the present embodiment, the installation recess 113a is further provided in the cavity 113, and the sub-substrate 120 is provided in the installation recess 113a. Through the configuration in which the sub-substrate 120 is seated in the installation recess 113a, UV light produced by optical components 130 can be guided more effectively to an opening of a main substrate 110. Herein, an insulating body 121 may be formed to have a height conforming to the height of the installation recess 113a. In other words, the insulating body 121 may not protrude outside the installation recess 113a.

As described above, according to the optical component package 10 according to the exemplary embodiment of the present invention, by providing the sub-substrate 120 having an increased size in the optical component package, it is possible to mount the plurality of optical components 130. Furthermore, by forming the through-hole 114 according to the present invention in the optical component package to allow the low-temperature fluid to flow therethrough, it is possible to dissipate heat of the optical component package 10 of which the temperature is increased by the optical components 130. Furthermore, by using the fluid to be sterilized or cured through the optical component package 10 for heat dissipation of the optical component package 10 before sterilization or curing, it is possible to reuse the fluid.

While particular embodiments of the optical component package and the device using the same according to the present invention have been described, it is merely illustrative and are not intended to limit the scope of the present invention and should be construed as having widest range based on the spirit of present invention. Those of ordinary skill in the art may combine and substitute the disclosed embodiments to perform a particular pattern of shape that has not been noted, but it is also within the scope of the present invention. It will be apparent to those of ordinary skill in the art that various changes and modifications may be readily made without departing from the spirit and scope of the invention.

What is claimed is:

1. An optical component package, comprising:
   a main substrate including a plurality of metal bodies, and a vertical insulation part provided between the metal bodies;
   a cavity provided in an upper surface of the main substrate;
   a sub-substrate provided in the cavity of the main substrate, the sub-substrate including an insulating body, a plurality of via holes vertically passing through the insulating body and filled with a metal material being electrically connected to each of the metal bodies, and a plurality of metal pads mounted on the insulating body and electrically connected to the plurality of via holes;
   a plurality of optical components mounted on the plurality of metal pads and electrically connected to the plurality of metal pads; and
   a light transmitting member provided above the main substrate.

2. The optical component package of claim 1, wherein the plurality of metal pads and the plurality of optical components are connected in series to each other.

3. The optical component package of claim 1, the plurality of metal pads and the plurality of optical components are connected in parallel to each other.

4. The optical component package of claim 1, wherein the plurality of metal pads and the plurality of optical components are connected in series-parallel to each other.

5. The optical component package of claim 1, wherein a plurality of plating layers are provided on the metal bodies, and the plating layers are electrically connected to different via holes, respectively.

6. The optical component package of claim 5, wherein the plating layers are partially exposed outside the sub-substrate, and a Zener diode is mounted on exposed portions of the plating layers.

7. The optical component package of claim 1, wherein the main substrate includes a through hole horizontally passing through the metal bodies.

* * * * *